United States Patent
Yang et al.

(10) Patent No.: US 12,230,622 B2
(45) Date of Patent: Feb. 18, 2025

(54) ELECTRONIC DEVICE WITH STACKED PRINTED CIRCUIT BOARDS

(71) Applicant: MEDIATEK INC., Hsin-Chu (TW)

(72) Inventors: Ya-Lun Yang, Hsinchu (TW); Wen-Chou Wu, Hsinchu (TW); Che-Hung Kuo, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 184 days.

(21) Appl. No.: 17/938,965

(22) Filed: Sep. 7, 2022

(65) Prior Publication Data

US 2023/0110957 A1 Apr. 13, 2023

Related U.S. Application Data

(60) Provisional application No. 63/255,028, filed on Oct. 13, 2021.

(51) Int. Cl.
| | |
|---|---|
| *H05K 1/14* | (2006.01) |
| *H01L 23/31* | (2006.01) |
| *H01L 23/367* | (2006.01) |
| *H01L 23/498* | (2006.01) |
| *H01L 23/538* | (2006.01) |
| *H01L 25/18* | (2023.01) |

(Continued)

(52) U.S. Cl.
CPC .......... *H01L 25/18* (2013.01); *H01L 23/3128* (2013.01); *H01L 23/367* (2013.01); *H01L 23/49811* (2013.01); *H01L 23/5383* (2013.01); *H01L 23/5389* (2013.01); *H05K 1/145* (2013.01); *H05K 1/181* (2013.01); *H01L 24/16* (2013.01); *H01L 2224/16145* (2013.01); *H01L 2224/16225* (2013.01)

(58) Field of Classification Search
CPC .... H05K 1/14; H05K 1/141–147; H05K 1/18; H05K 1/181–187; H01L 23/3128; H01L 23/367; H01L 23/498; H01L 23/49811; H01L 23/5383; H01L 23/5389; H01L 23/3135
USPC ................. 361/770–795; 174/260–262, 520; 257/660–690, 730–737, 787–790
See application file for complete search history.

(56) References Cited

U.S. PATENT DOCUMENTS

| | | | |
|---|---|---|---|
| 7,312,519 B2 * | 12/2007 | Song | H01L 25/16 257/782 |
| 7,750,455 B2 * | 7/2010 | Pagaila | H01L 25/105 257/E23.169 |

(Continued)

FOREIGN PATENT DOCUMENTS

| | | |
|---|---|---|
| EP | 2 940 729 A1 | 11/2015 |
| KR | 10-2018-0064743 A | 6/2018 |

(Continued)

*Primary Examiner* — Tuan T Dinh
(74) *Attorney, Agent, or Firm* — Winston Hsu

(57) ABSTRACT

An electronic device includes a main printed circuit board (PCB) assembly comprising a bottom PCB and a semiconductor package mounted on an upper surface of the bottom PCB. The semiconductor package includes a substrate and a semiconductor die mounted on a top surface of the substrate. The semiconductor die and the top surface of the substrate are encapsulated by a molding compound. A top PCB is mounted on the semiconductor package through first connecting elements.

20 Claims, 6 Drawing Sheets

(51) Int. Cl.
*H05K 1/18* (2006.01)
*H01L 23/00* (2006.01)

(56) References Cited

U.S. PATENT DOCUMENTS

| | | | | |
|---|---|---|---|---|
| 7,968,995 B2* | 6/2011 | Ko | ............................ | H01L 25/50 |
| | | | | 257/777 |
| 11,127,650 B2 | 9/2021 | Chang Chien | | |
| 2015/0170991 A1* | 6/2015 | Li | ........................ | H01L 23/4334 |
| | | | | 438/109 |
| 2015/0279431 A1* | 10/2015 | Li | ........................ | H01L 25/0657 |
| | | | | 438/109 |
| 2016/0079220 A1* | 3/2016 | Lin | ...................... | H01L 25/0655 |
| | | | | 257/737 |
| 2016/0099231 A1* | 4/2016 | Yang | ................... | H01L 23/3171 |
| | | | | 257/774 |
| 2017/0077073 A1* | 3/2017 | Lin | .......................... | H01L 25/50 |
| 2017/0084589 A1* | 3/2017 | Kuo | ..................... | H01L 23/3128 |
| 2019/0109115 A1 | 4/2019 | Singh | | |
| 2019/0280368 A1 | 9/2019 | Khan | | |
| 2019/0393141 A1 | 12/2019 | Cheah | | |
| 2020/0083151 A1 | 3/2020 | Chen | | |
| 2020/0194331 A1* | 6/2020 | Kim | ........................ | H01L 25/50 |
| 2020/0203309 A1 | 6/2020 | Beyne | | |
| 2020/0219784 A1* | 7/2020 | Kim | .................... | H01L 23/4334 |
| 2021/0020574 A1 | 1/2021 | Yu | | |
| 2021/0183794 A1 | 6/2021 | Tang | | |
| 2021/0210400 A1 | 7/2021 | Chen | | |
| 2021/0272906 A1* | 9/2021 | Kim | .................... | H01L 25/0655 |

FOREIGN PATENT DOCUMENTS

TW    201842598 A    12/2018
TW    202002190 A    1/2020

* cited by examiner

ELECTRONIC DEVICE WITH STACKED PRINTED CIRCUIT BOARDS

CROSS REFERENCE TO RELATED APPLICATIONS

This application claims the benefit of U.S. Provisional Application No. 63/255,028, filed on Oct. 13, 2021. The content of the application is incorporated herein by reference.

BACKGROUND

The present disclosure relates generally to the field of semiconductor packaging. More particularly, the present disclosure relates to an electronic device with stacked printed circuit boards (PCBs).

Increased miniaturization of components, greater packaging density of integrated circuits ("ICs"), higher performance, and lower cost are ongoing goals of the computer industry. To support the electronic devices with higher functionality and better performance, more and more signal balls are integrated into one single chip package, which leads to the increase of the overall package size.

PCB designer are facing the same problem. As known in the art, PCBs are flat structures that present bonding pads on the surfaces for the fixation of circuit components. The flat structure of the PCBs imposes a constraint to the shape of the electronic device.

SUMMARY

One object of the present disclosure is to provide an electronic device with stacked printed circuit boards in order to solve the above-mentioned prior at shortcomings or deficiencies.

One aspect of the disclosure provides an electronic device including a main printed circuit board (PCB) assembly comprising a bottom PCB and a semiconductor package mounted on an upper surface of the bottom PCB. The semiconductor package includes a substrate and a semiconductor die mounted on a top surface of the substrate. The semiconductor die and the top surface of the substrate are encapsulated by a molding compound. A top PCB is mounted on the semiconductor package through first connecting elements.

According to some embodiments, the semiconductor package comprises a flip-chip die, a wire-bonding die, or a fan-out die.

According to some embodiments, the semiconductor die has an active surface and a rear surface coupled to the top surface of the substrate, wherein the semiconductor die comprises through silicon vias.

According to some embodiments, the electronic device further includes a middle re-distribution layer (RDL) structure disposed between the semiconductor die and the top PCB. The active surface of the semiconductor die is directly connected to the middle RDL structure through second connecting elements. The middle RDL structure comprises dielectric layers and interconnect structures.

According to some embodiments, the electronic device further includes a memory component mounted on the middle RDL structure. The memory component is electrically connected to the substrate via the interconnect structures of the middle RDL structure and the through silicon vias of the semiconductor die.

According to some embodiments, the electronic device further includes a heat sink mounted on the middle RDL structure around the memory component.

According to some embodiments, the memory component is High-Bandwidth Memory (HBM) comprising dynamic random-access memory (DRAM) dies stacked on one another, which are vertically interconnected by through silicon vias.

According to some embodiments, the electronic device further includes a plurality of through mold vias (TMVs) disposed in the molding compound. The TMVs penetrate through an entire thickness of the molding compound, thereby forming terminals on a top surface of the semiconductor package.

According to some embodiments, the top PCB is mounted on the terminals.

According to some embodiments, the substrate is a re-distribution layer (RDL) substrate.

According to some embodiments, the electronic device further includes a top PCB assembly mounted on the semiconductor package through third connecting elements.

According to some embodiments, the PCB assembly comprises a PCB and a component mounted on the PCB.

According to some embodiments, the component comprises a memory device, an antenna device or an RF device.

Another aspect of the disclosure provides an electronic device including a main printed circuit board (PCB) assembly having a bottom PCB and a semiconductor package mounted on an upper surface of the bottom PCB. The semiconductor package includes a substrate, a semiconductor die mounted on a top surface of the substrate, and a memory component mounted on the semiconductor die. A top PCB is mounted on the semiconductor package through first connecting elements.

According to some embodiments, the semiconductor die has an active surface and a rear surface coupled to the top surface of the substrate, wherein the semiconductor die comprises through silicon vias.

According to some embodiments, the active surface directly faces the memory component.

According to some embodiments, the active surface directly faces the substrate.

According to some embodiments, the memory component is High-Bandwidth Memory (HBM) comprising dynamic random-access memory (DRAM) dies stacked on one another, which are vertically interconnected by through silicon vias.

According to some embodiments, the semiconductor die and the top surface of the substrate are encapsulated by a first molding compound, and wherein the memory component is encapsulated by a second molding compound.

According to some embodiments, the electronic device further includes a plurality of first through mold vias (TMVs) disposed in the first molding compound. The first TMVs penetrate through an entire thickness of the first molding compound.

According to some embodiments, the electronic device further includes a plurality of second through mold vias (TMVs) disposed in the second molding compound, wherein the second TMVs penetrate through an entire thickness of the second molding compound.

According to some embodiments, the semiconductor die, the memory component, and the top surface of the substrate are encapsulated by a unified molding compound.

According to some embodiments, the electronic device further includes a middle re-distribution layer (RDL) structure disposed between the semiconductor die and the memory component. The active surface of the semiconductor die is directly connected to the middle RDL structure through second connecting elements. The middle RDL structure comprises dielectric layers and interconnect structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Packaging of an integrated circuit (IC) chip can involve attaching the IC chip to a substrate (e.g., a packaging substrate) which, among other things, provides mechanical support and electrical connections between the chip and other electronic components of a device. Substrate types include, for example, cored substrates, including thin core, thick core (laminate bismaleimide-triazine resin (BT resin) or FR-4 type fibrous board material), and laminate core, as well as coreless substrates. Cored package substrates, for example, can be built up layer by layer around a central core, with layers of conductive material (usually copper) separated by layers of insulating dielectric, with interlayer connections being formed with through holes or microvias (vias).

High Bandwidth Memory (HBM) is a high-speed computer memory interface for 3D-stacked synchronous dynamic random-access memory (SDRAM). HBM achieves higher bandwidth while using less power in a substantially smaller form factor than DDR4 or GDDR5. This is achieved by stacking up to eight dynamic random-access memory (DRAM) dies and an optional base die which can include buffer circuitry and test logic. The stack is often connected to the memory controller on a GPU or CPU through a substrate, such as a silicon interposer. Alternatively, the memory die could be stacked directly on the CPU or GPU chip. Within the stack the die are vertically interconnected by through-silicon vias (TSVs) and microbumps. The HBM DRAM uses wide-interface architecture to achieve high-speed, low-power operation.

Figure 1:
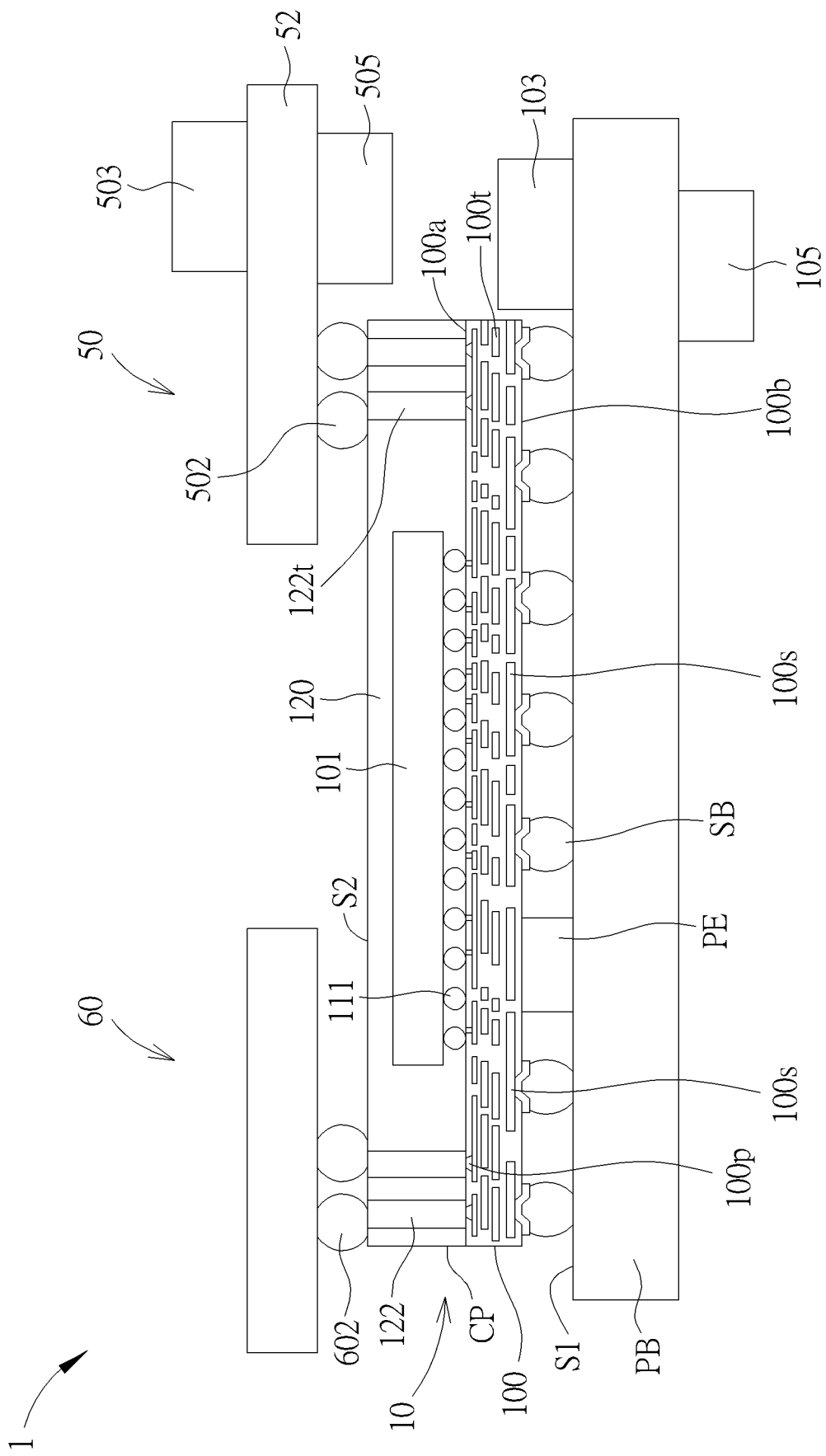
FIG. 1 is a schematic, cross-sectional diagram showing an exemplary electronic device with stacked printed circuit boards (PCBs) in accordance with one embodiment of the disclosure.

FIG. 1 is a schematic, cross-sectional diagram showing an exemplary electronic device 1 with stacked printed circuit boards (PCBs) in accordance with one embodiment of the disclosure. In some embodiments, the electronic device 1 may serve as a three-dimensional (3D) assembly including at least two vertically stacked PCBs respectively mounted on opposite sides of a semiconductor package. As shown in FIG. 1, the electronic device 1 comprises a main PCB assembly 10 including, but not limited to, a bottom PCB PB and a semiconductor package CP mounted on an upper surface S1 of the bottom PCB PB. In some embodiments, for example, the semiconductor package CP may comprise a substrate 100 and a semiconductor die 101, such as a logic die, mounted on a top surface (die-attach surface) 100a of the substrate 100. The semiconductor die 101 may comprise a flip-chip die, a wire-bonding die, or a fan-out die. The semiconductor die 101 may be connected to the top surface 100a of the substrate 100 via a plurality of connecting elements 111 such as bumps or metal pillars, but not limited thereto. The semiconductor die 101 and the top surface 100a of the substrate 100 may be encapsulated by a molding compound 120 such as epoxy resin.

According to an embodiment, for example, additional components 103 and 105 may be mounted on the surfaces of the bottom PCB PB. The additional components 103 and 105 may comprise active or passive components such as IC chips, capacitors, resistors or inductors. Although the semiconductor die 101 is shown to be mounted on the top surface 100a of the substrate 100 in a flip-chip manner, it is understood that in some embodiments the semiconductor die 101 may be mounted on the substrate 100 by using wire-bonding techniques. In some embodiments, the semiconductor package CP may include a fan-out die.

In some embodiments, the semiconductor package CP may include one or more logic dies, including, but not limited to, a central processing unit (CPU), a graphics processing unit (GPU), a system-on-a-chip (SOC), a field-programmable gate array (FPGA), a microcontroller unit (MCU), a power management integrated circuit (PMIC) die, a radio frequency (RF) die, a sensor die, a micro-electromechanical-system (MEMS) die, a signal processing die (e.g., digital signal processing (DSP) die), or the like, or any combinations thereof.

According to an embodiment, for example, the substrate 100 may be a wiring substrate and may be formed of polymer materials such as bismaleimide triazine (BT) laminates and/or build-up films known in the art. In some embodiments, the substrate 100 may be a re-distribution layer (RDL) substrate comprising dielectric layers and conductive layers, and may have a thinner thickness compared to conventional package substrates. It is to be understood that the substrate 100 may be a single layer or a multi-layer structure.

According to an embodiment, for example, the substrate 100 may comprise a plurality of connection pads 100$p$ disposed on or near the top surface 100$a$ of the substrate 100. According to an embodiment, for example, the substrate 100 may comprise a plurality of conductive traces 100$t$ interconnecting the plurality of connection pads 100$p$ with a plurality of ball pads 100$s$ distributed on or near a bottom surface 100$b$ of the substrate 100. Solder balls SB are disposed on the ball pads 100$s$, respectively. In some embodiments, at least one passive device PE may be mounted on the bottom surface 100$b$ of the substrate 100 using surface mount technique (SMT).

According to an embodiment, a plurality of through mold vias (TMVs) 122 may be disposed in the molding compound 120. The TMVs 122 penetrate through the entire thickness of the molding compound 120, thereby forming terminals 122$t$ on the top surface S2 of the semiconductor package CP. According to an embodiment, for example, a PCB assembly 50 and a PCB 60 may be mounted on the corresponding terminals 122$t$ on the top surface S2 of the semiconductor package CP through connecting elements 502 and 602, respectively. According to an embodiment, for example, the connecting elements 502 and 602 may comprise solder balls or any suitable conducive joints known in the art. According to an embodiment, for example, the PCB assembly 50 may comprise a PCB 52 and components 503 and 505 such as, memory devices, antenna devices or radio-frequency (RF) devices mounted on opposite sides of the PCB 52. According to an embodiment, the PCB assembly 50 is physically separated from the PCB 60 and disposed on the top surface S2 of the semiconductor package CP in a side-by-side manner.

It is advantageous to use the present disclosure because by connecting some signals to the PCB assembly 50 and the PCB 60 through the TMVs 122, the bottom ball count and the size of the semiconductor package CP can both be reduced.

Figure 2:
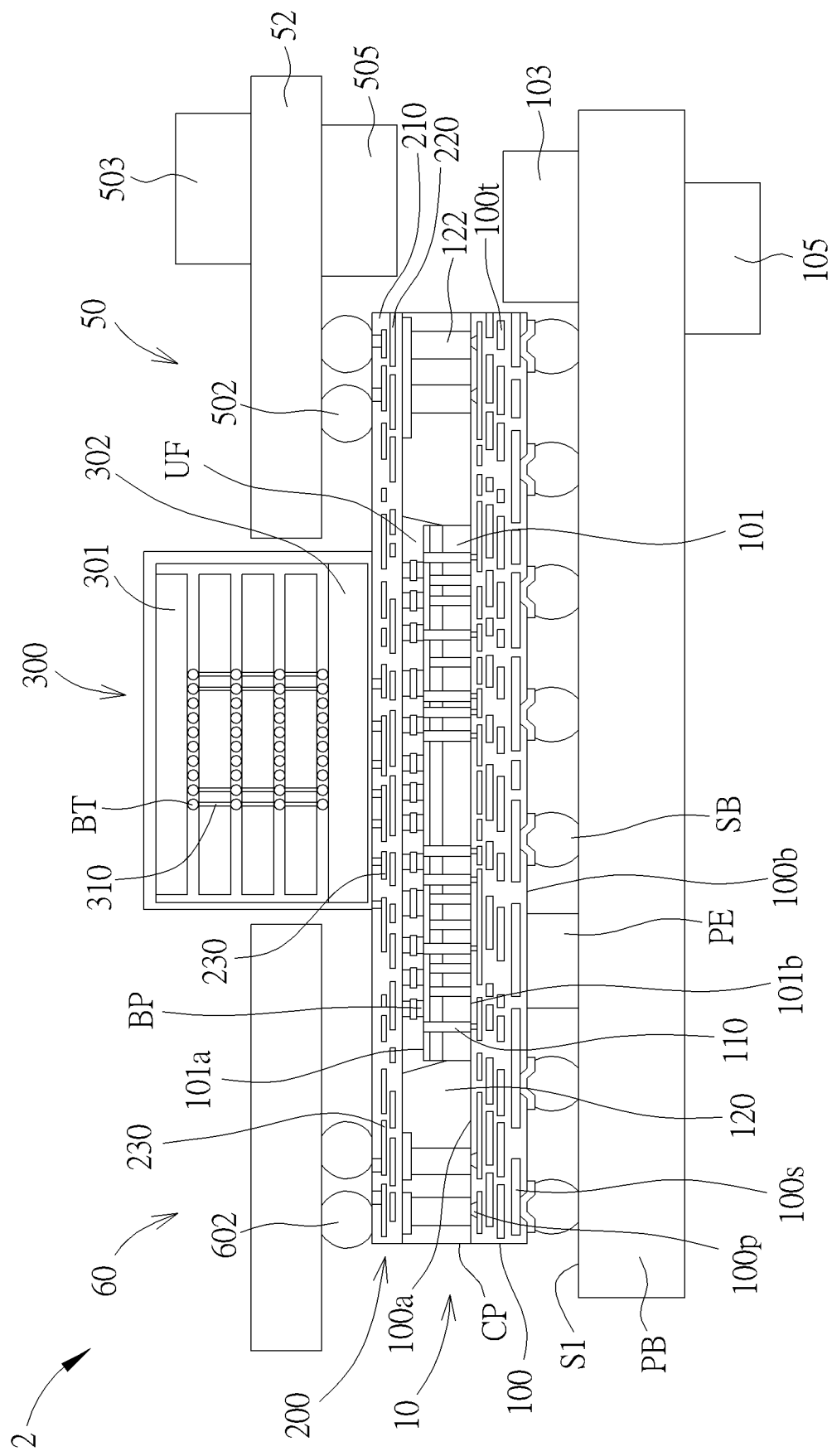
FIG. 2 is a schematic, cross-sectional diagram showing an exemplary electronic device with stacked PCBs in accordance with another embodiment of the disclosure.

FIG. 2 is a schematic, cross-sectional diagram showing an exemplary electronic device 2 with stacked PCBs in accordance with another embodiment of the disclosure, wherein like regions, layers or elements are designated by like numeral numbers or labels. In some embodiments, the electronic device 2 may serve as a 3D assembly including at least two vertically stacked PCBs respectively mounted on opposite sides of a semiconductor package. As shown in FIG. 2, likewise, the electronic device 2 comprises a main PCB assembly 10 including, but not limited to, a bottom PCB PB and a semiconductor package CP mounted on an upper surface S1 of the bottom PCB PB. In some embodiments, for example, the semiconductor package CP may comprise a substrate 100 and a semiconductor die 101, such as a logic die, mounted on a top surface (die-attach surface) 100$a$ of the substrate 100. The semiconductor die 101 may be connected to the top surface 100$a$ of the substrate 100 via a plurality of through silicon vias (TSVs) 110 that penetrates through the entire thickness of the semiconductor die 101. The peripheral sidewalls of the semiconductor die 101 and the top surface 100$a$ of the substrate 100 may be encapsulated by a molding compound 120 such as epoxy resin.

According to an embodiment, for example, additional components 103 and 105 may be mounted on the surfaces of the bottom PCB PB. The additional components 103 and 105 may comprise active or passive components such as IC chips, capacitors, resistors or inductors.

In some embodiments, the semiconductor package CP may include one or more logic dies, including, but not limited to, a central processing unit (CPU), a graphics processing unit (GPU), a system-on-a-chip (SOC), a field-programmable gate array (FPGA), a microcontroller unit (MCU), a power management integrated circuit (PMIC) die, a radio frequency (RF) die, a sensor die, a micro-electro-mechanical-system (MEMS) die, a signal processing die (e.g., digital signal processing (DSP) die), or the like, or any combinations thereof.

According to an embodiment, for example, the substrate 100 may be a wiring substrate and may be formed of polymer materials such as bismaleimide triazine (BT) laminates and/or build-up films known in the art. In some embodiments, the substrate 100 may be a re-distribution layer (RDL) substrate comprising dielectric layers and conductive layers, and may have a thinner thickness compared to conventional package substrates. It is to be understood that the substrate 100 may be a single layer or a multi-layer structure.

According to an embodiment, for example, the substrate 100 may comprise a plurality of connection pads 100$p$ disposed on or near the top surface 100$a$ of the substrate 100. According to an embodiment, for example, the substrate 100 may comprise a plurality of conductive traces 100$t$ interconnecting the plurality of connection pads 100$p$ with a plurality of ball pads 100$s$ distributed on or near a bottom surface 100$b$ of the substrate 100. Solder balls SB are disposed on the ball pads 100$s$, respectively. In some embodiments, at least one passive device PE may be mounted on the bottom surface 100$b$ of the substrate 100 using surface mount technique (SMT).

According to an embodiment, the semiconductor die 101 is mounted on the top surface 100$a$ of the substrate 100. According to an embodiment, the semiconductor die 101 has a top surface (or active surface) 101$a$ and a passive rear surface 101$b$. The circuit elements such as transistors are fabricated on or near the top surface 101$a$ of the semiconductor die 101. According to an embodiment, the passive rear surface 101$b$ of the semiconductor die 101 may be coupled to the top surface 100$a$ of the substrate 100 by using methods known in the art, for example, SMT or adhesion. That is, the semiconductor die 101 is mounted on the top surface 100$a$ of the substrate 100 with a "face-up" configuration. According to an embodiment, the semiconductor die 101 may be electrically connected to the substrate 100 and the solder balls SB on the bottom surface 100$b$ of the substrate 100 through the TSVs 110, which are mainly for power/ground connection of the semiconductor die 101 or HBM. According to an embodiment, for example, the TSVs 110 may be power or ground TSVs for transmitting power or ground signals.

According to an embodiment, the electronic device 2 further comprises a middle re-distribution layer (RDL) structure 200 on the semiconductor die 101. According to an embodiment, the middle RDL structure 200 may comprise dielectric layers 210 and interconnect structures 220. The interconnect structures 220 may be electrically connected to a plurality of RDL pads 230. According to an embodiment, the top surface 101a of the semiconductor die 101 is electrically connected to the middle RDL structure 200 through connecting elements BP such as micro-bumps, metal pillars, or the like. According to an embodiment, the gap between the middle RDL structure 200 and the top surface 101a of the semiconductor die 101 may be filled with an underfill material UF such as an epoxy resin, but is not limited thereto. According to an embodiment, a plurality of through mold vias (TMVs) 122 may be disposed in the molding compound 120. The TMVs 122 may be electrically connected to the interconnect structures 220 of the middle RDL structure 200.

According to an embodiment, for example, a PCB assembly 50 and a PCB 60 may be mounted on the corresponding RDL pads 230 of the middle RDL structure 200. According to an embodiment, for example, the PCB assembly 50 may comprise a PCB 52 and components 503 and 505 mounted on opposite sides of the PCB 52 through connecting elements 502 and 602, respectively. According to an embodiment, for example, the connecting elements 502 and 602 may comprise solder balls or any suitable conducive joints known in the art. According to an embodiment, the PCB assembly 50 is physically separated from the PCB 60 and disposed on the middle RDL structure 200 with the PCB 60 in a side-by-side manner.

According to an embodiment, a memory component 300 is directly mounted on the middle RDL structure 200 and may be disposed between the PCB 60 and the PCB assembly 50. According to an embodiment, the memory component 300 may protrude from top surfaces of the PCB 60 and the PCB assembly 50. According to an embodiment, the memory component 300 may comprise a High-Bandwidth Memory (HBM) including multiple DRAM dies 301 stacked on one another and the stacked DRAM dies 301 are vertically interconnected by through silicon vias (TSVs) 310 and microbumps BT. According to an embodiment, the memory component 300 may further comprise a DRAM base 302 which can include buffer circuitry and test logic. In some embodiments, the DRAM base 302 may include a DRAM controller.

According to an embodiment, the memory component 300 may be aligned with the underlying semiconductor die 101 and disposed at or near the center of the semiconductor die 101 when viewed from above. That is, the center of the memory component 300 may be aligned with the center of the semiconductor die 101. When viewed from above, the memory component 300 completely overlaps with the underlying semiconductor die 101. According to an embodiment, the DRAM base 302 is electrically coupled to the middle RDL structure 200 and signals such as power or ground may be transmitted to the solder balls SB on the bottom surface 100b of the substrate 100 via the shorter conductive path comprised at least of the interconnect structures 220 of the middle RDL structure 200, the connecting elements BP, the TSVs 110 of the semiconductor die 101, and the conductive traces 100t of the substrate 100. Optionally, some of the power or ground signals may be transmitted to the solder balls SB on the bottom surface 100b of the substrate 100 via the connecting elements BP, the interconnect structures 220 of the middle RDL structure 200, the TMVs 122, and the conductive traces 100t of the substrate 100.

Figure 3:
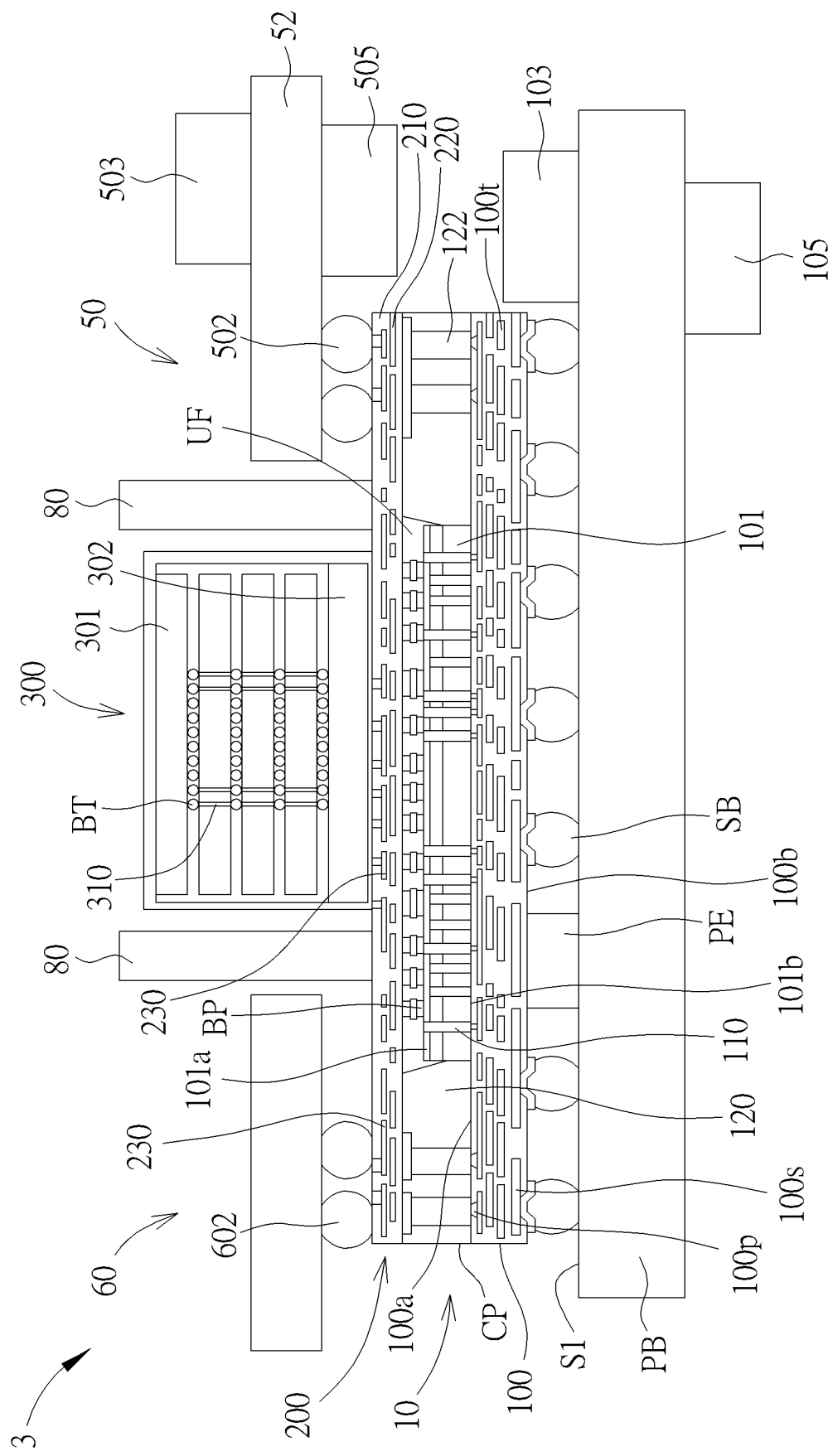
FIG. 3 is a schematic, cross-sectional diagram showing an exemplary electronic device with stacked PCBs in accordance with another embodiment of the disclosure.

FIG. 3 is a schematic, cross-sectional diagram showing an exemplary electronic device 3 with stacked PCBs in accordance with still another embodiment of the disclosure, wherein like regions, layers or elements are designated by like numeral numbers or labels. One difference between the electronic device 3 in FIG. 3 and the electronic device 2 in FIG. 2 is that a heat sink 80 is mounted on the middle RDL structure 200 around the memory component 300 to improve thermal performance and the robustness of the electronic device 3. According to an embodiment, the heat sink 80 may have an annular shape and surround the memory component 300, but not limited thereto.

Figure 4:
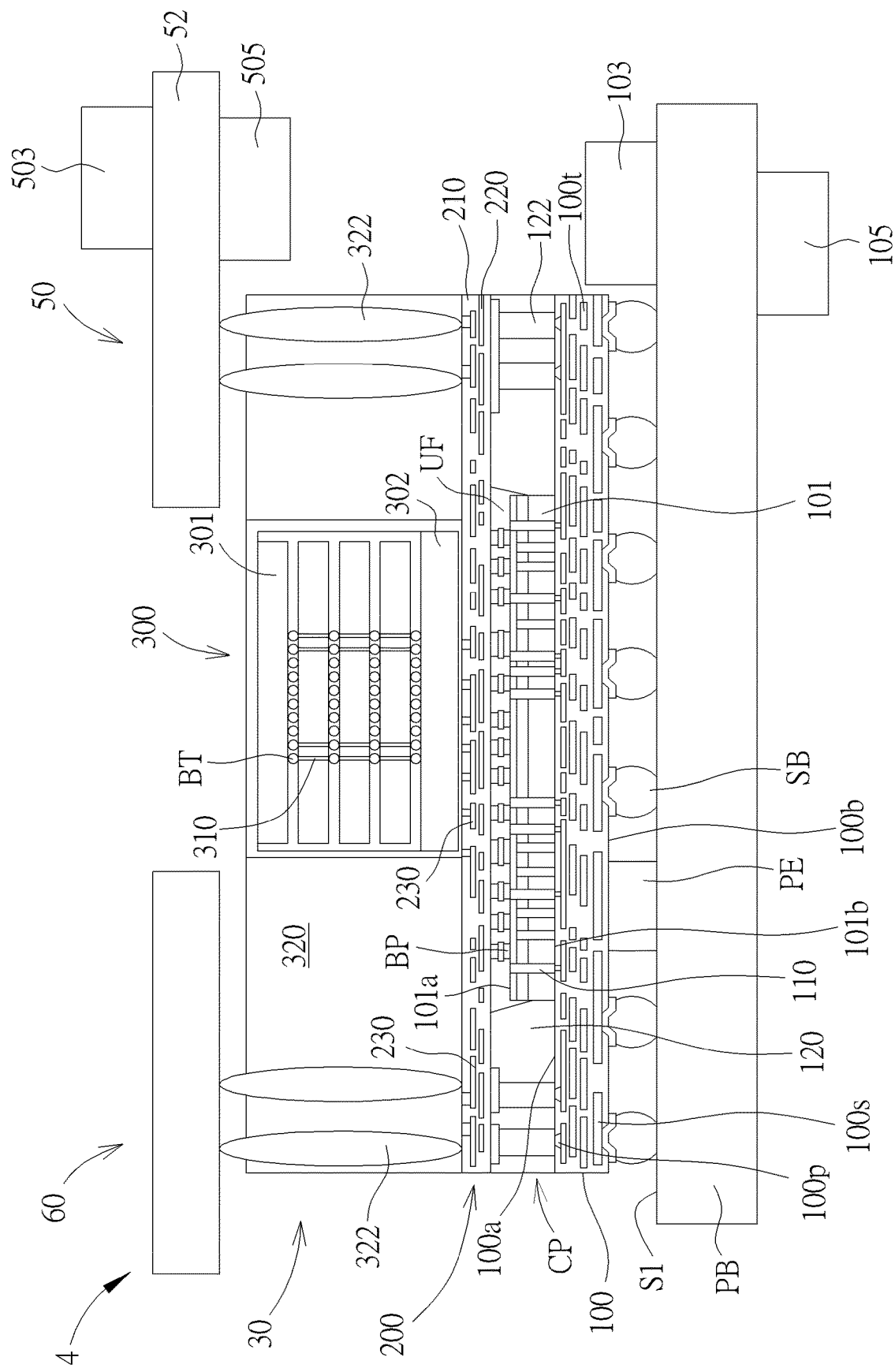
FIG. 4 is a schematic, cross-sectional diagram showing an exemplary electronic device with stacked PCBs in accordance with another embodiment of the disclosure.

FIG. 4 is a schematic, cross-sectional diagram showing an exemplary electronic device 4 with stacked PCBs in accordance with still another embodiment of the disclosure, wherein like regions, layers or elements are designated by like numeral numbers or labels. In some embodiments, the electronic device 4 may serve as a 3D assembly including at least two vertically stacked PCBs respectively mounted on opposite sides of a semiconductor package. As shown in FIG. 4, likewise, the electronic device 4 comprises a main PCB assembly 10 including, but not limited to, a bottom PCB PB and a semiconductor package CP mounted on an upper surface S1 of the bottom PCB PB. In some embodiments, for example, the semiconductor package CP may comprise a substrate 100 and a semiconductor die 101, such as a logic die, mounted on a top surface 100a of the substrate 100. The semiconductor die 101 may be connected to the top surface 100a of the substrate 100 via a plurality of TSVs 110 that penetrates through the entire thickness of the semiconductor die 101. The peripheral sidewalls of the semiconductor die 101 and the top surface 100a of the substrate 100 may be encapsulated by a molding compound 120 such as epoxy resin.

According to an embodiment, for example, additional components 103 and 105 may be mounted on the surfaces of the bottom PCB PB. The additional components 103 and 105 may comprise active or passive components such as IC chips, capacitors, resistors or inductors.

In some embodiments, the semiconductor package CP may include one or more logic dies, including, but not limited to, a central processing unit (CPU), a graphics processing unit (GPU), a system-on-a-chip (SOC), a field-programmable gate array (FPGA), a microcontroller unit (MCU), a power management integrated circuit (PMIC) die, a radio frequency (RF) die, a sensor die, a micro-electro-mechanical-system (MEMS) die, a signal processing die (e.g., digital signal processing (DSP) die), or the like, or any combinations thereof.

According to an embodiment, for example, the substrate 100 may be a wiring substrate and may be formed of polymer materials such as BT laminates and/or build-up films known in the art. In some embodiments, the substrate 100 may be a RDL substrate comprising dielectric layers and conductive layers, which have thinner thickness compared to conventional package substrates. It is to be understood that the substrate 100 may be a single layer or a multi-layer structure.

According to an embodiment, for example, the substrate 100 may comprise a plurality of connection pads 100p disposed on or near the top surface 100a of the substrate 100. According to an embodiment, for example, the substrate 100 may comprise a plurality of conductive traces 100t interconnecting the plurality of connection pads 100p with a plurality of ball pads 100s distributed on or near a bottom surface 100b of the substrate 100. Solder balls SB are disposed on the ball pads 100s, respectively. In some embodiments, at least one passive device PE may be mounted on the bottom surface 100b of the substrate 100 using SMT.

According to an embodiment, the semiconductor die 101 is mounted on the top surface 100a of the substrate 100. According to an embodiment, the semiconductor die 101 has a top surface (or active surface) 101a and a passive rear surface 101b. The circuit elements such as transistors are fabricated on or near the top surface 101a of the semiconductor die 101. According to an embodiment, the passive rear surface 101b of the semiconductor die 101 may be coupled to the top surface 100a of the substrate 100 by using methods known in the art, for example, SMT or adhesion. That is, the semiconductor die 101 is mounted on the top surface 100a of the substrate 100 with a "face-up" configuration. According to an embodiment, the semiconductor die 101 may be electrically connected to the substrate 100 and the solder balls SB on the bottom surface 100b of the substrate 100 through the TSVs 110, which are mainly for power/ground connection of the semiconductor die 101 or HBM. According to an embodiment, for example, the TSVs 110 may be power or ground TSVs for transmitting power or ground signals.

According to an embodiment, likewise, the electronic device 4 comprises a middle RDL structure 200 on the semiconductor die 101. According to an embodiment, the middle RDL structure 200 may comprise dielectric layers 210 and interconnect structures 220. The interconnect structures 220 may be electrically connected to a plurality of RDL pads 230. According to an embodiment, the top surface 101a of the semiconductor die 101 is electrically connected to the middle RDL structure 200 through connecting elements BP such as micro-bumps, metal pillars, or the like. According to an embodiment, the gap between the middle RDL structure 200 and the top surface 101a of the semiconductor die 101 may be filled with an underfill material UF such as an epoxy resin, but is not limited thereto. According to an embodiment, a plurality of TMVs 122 may be disposed in the molding compound 120. The TMVs 122 may be electrically connected to the interconnect structures 220 of the middle RDL structure 200.

According to an embodiment, a memory package 30 is directly mounted on the middle RDL structure 200. According to an embodiment, the memory package 30 comprises a memory component 300 comprising a HBM including multiple DRAM dies 301 stacked on one another and the stacked DRAM dies 301 are vertically interconnected by TSVs 310 and microbumps BT. According to an embodiment, the memory component 300 may further comprise a DRAM base 302 which can include buffer circuitry and test logic. In some embodiments, the DRAM base 302 may include a DRAM controller. According to an embodiment, the memory component 300 is packaged by a molding compound 320.

According to an embodiment, the memory component 300 may be aligned with the underlying semiconductor die 101 and disposed at or near the center of the semiconductor die 101 when viewed from above. That is, the center of the memory component 300 may be aligned with the center of the semiconductor die 101. When viewed from above, the memory component 300 completely overlaps with the underlying semiconductor die 101. According to some embodiments, the memory component 300 may not be aligned with the underlying semiconductor die 101.

According to an embodiment, the DRAM base 302 is electrically coupled to the middle RDL structure 200 and signals such as power or ground may be transmitted to the solder balls SB on the bottom surface 100b of the substrate 100 via the shorter conductive path comprised at least of the interconnect structures 220 of the middle RDL structure 200, the connecting elements BP, the TSVs 110 of the semiconductor die 101, and the conductive traces 100t of the substrate 100. Optionally, some of the power or ground signals may be transmitted to the solder balls SB on the bottom surface 100b of the substrate 100 via the connecting elements BP, the interconnect structures 220 of the middle RDL structure 200, the TMVs 122, and the conductive traces 100t of the substrate 100.

According to an embodiment, for example, a PCB assembly 50 and a PCB 60 may be mounted on the memory package 30 in a side-by-side manner. According to an embodiment, for example, the PCB assembly 50 and the PCB 60 may be electrically connected to the corresponding RDL pads 230 of the middle RDL structure 200 via the TMVs 322 in the molding compound 320. According to an embodiment, for example, the PCB assembly 50 may comprise a PCB 52 and components 503 and 505 mounted on opposite sides of the PCB 52, respectively.

Figure 5:
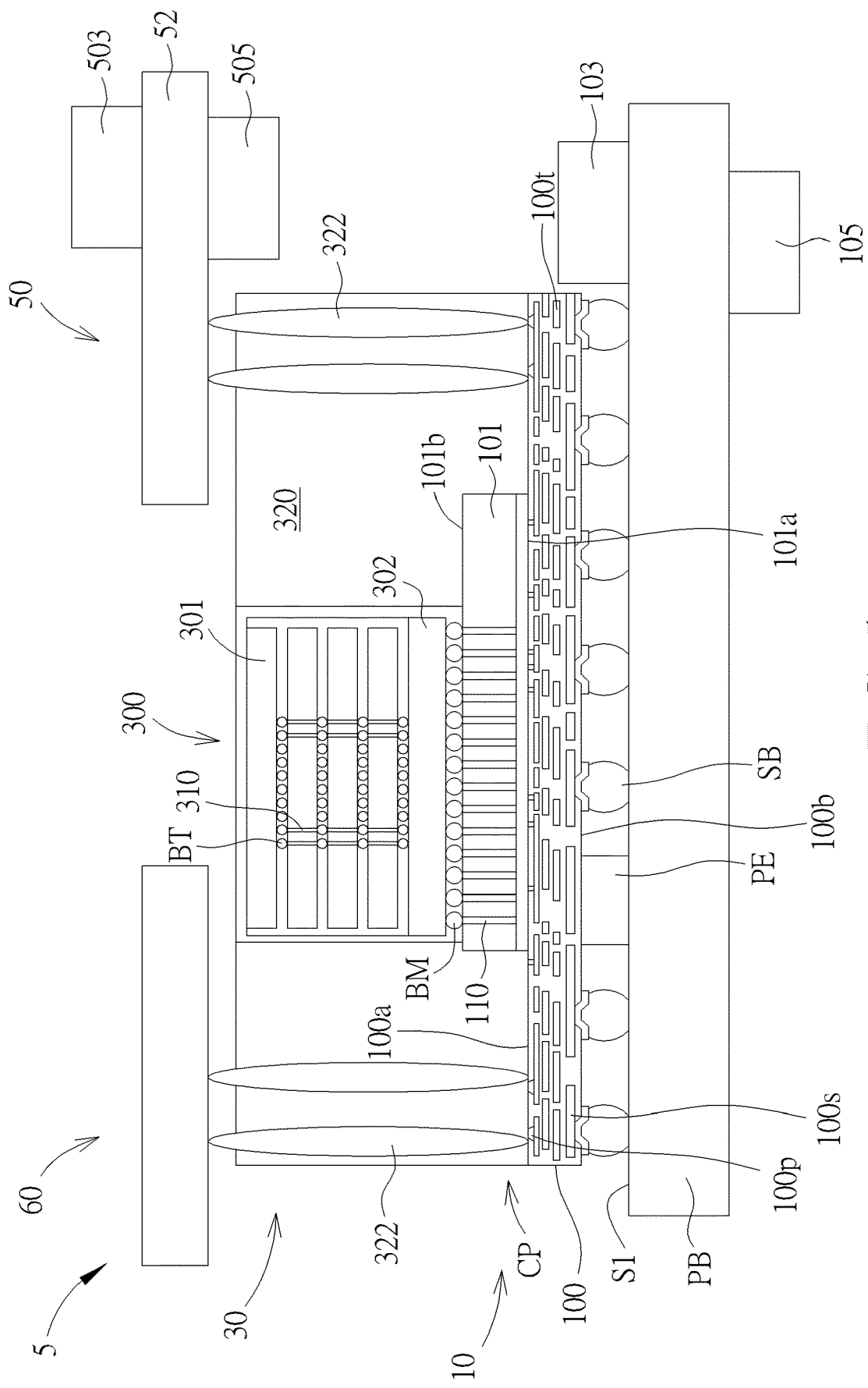
FIG. 5 is a schematic, cross-sectional diagram showing an exemplary electronic device with stacked PCBs in accordance with another embodiment of the disclosure.

FIG. 5 is a schematic, cross-sectional diagram showing an exemplary electronic device 5 with stacked PCBs in accordance with still another embodiment of the disclosure, wherein like regions, layers or elements are designated by like numeral numbers or labels. In some embodiments, the electronic device 5 may serve as a 3D assembly including at least two vertically stacked PCBs respectively mounted on opposite sides of a semiconductor package. As shown in FIG. 5, likewise, the electronic device 5 comprises a main PCB assembly 10 including, but not limited to, a bottom PCB PB and a semiconductor package CP mounted on an upper surface S1 of the bottom PCB PB. In some embodiments, for example, the semiconductor package CP may comprise a substrate 100 and a semiconductor die 101, such as a logic die, mounted on a top surface 100a of the substrate 100. The semiconductor die 101 may be connected to the top surface 100a of the substrate 100 via a plurality of TSVs 110 that penetrates through the entire thickness of the semiconductor die 101. The peripheral sidewalls of the semiconductor die 101 and the top surface 100a of the substrate 100 may be encapsulated by a molding compound 120 such as epoxy resin.

According to an embodiment, for example, additional components 103 and 105 may be mounted on the surfaces of the bottom PCB PB. The additional components 103 and 105 may comprise active or passive components such as IC chips, capacitors, resistors or inductors.

In some embodiments, the semiconductor package CP may include one or more logic dies, including, but not limited to, a central processing unit (CPU), a graphics processing unit (GPU), a system-on-a-chip (SOC), a field-programmable gate array (FPGA), a microcontroller unit (MCU), a power management integrated circuit (PMIC) die, a radio frequency (RF) die, a sensor die, a micro-electro-mechanical-system (MEMS) die, a signal processing die (e.g., digital signal processing (DSP) die), or the like, or any combinations thereof.

According to an embodiment, for example, the substrate 100 may be a wiring substrate and may be formed of polymer materials such as BT laminates and/or build-up films known in the art. In some embodiments, the substrate 100 may be a RDL substrate comprising dielectric layers and conductive layers, which have thinner thickness compared to conventional package substrates. It is to be understood that the substrate 100 may be a single layer or a multi-layer structure.

According to an embodiment, for example, the substrate 100 may comprise a plurality of connection pads 100p disposed on or near the top surface 100a of the substrate 100.

According to an embodiment, for example, the substrate 100 may comprise a plurality of conductive traces 100*t* interconnecting the plurality of connection pads 100*p* with a plurality of ball pads 100*s* distributed on or near a bottom surface 100*b* of the substrate 100. Solder balls SB are disposed on the ball pads 100*s*, respectively. In some embodiments, at least one passive device PE may be mounted on the bottom surface 100*b* of the substrate 100 using SMT.

According to an embodiment, the semiconductor die 101 is mounted on the top surface 100*a* of the substrate 100 with a "face-down" configuration with its top surface (or active surface) 101*a* directly facing the substrate 100. According to an embodiment, the semiconductor die 101 may be electrically connected to the substrate 100 and the solder balls SB on the bottom surface 100*b* of the substrate 100 via the TSVs 110, which are mainly for power/ground connection of the semiconductor die 101 or HBM. According to an embodiment, for example, the TSVs 110 may be power or ground TSVs for transmitting power or ground signals.

According to an embodiment, a memory component 300 such as HBM is directly mounted on the semiconductor die 101. According to an embodiment, the memory component 300 may be electrically connected to the semiconductor die 101 through the connecting elements BM such as microbumps or metal pillars. According to an embodiment, the memory component 300 may comprise multiple DRAM dies 301 stacked on one another. The stacked DRAM dies 301 are vertically interconnected by TSVs 310 and microbumps BT. According to an embodiment, the memory component 300 may further comprise a DRAM base 302 which can include buffer circuitry and test logic. In some embodiments, the DRAM base 302 may include a DRAM controller. According to an embodiment, the semiconductor die 101 and the memory component 300 may be packaged in one unified molding compound 320.

According to an embodiment, the memory component 300 may be offset from the center of the underlying semiconductor die 101, That is, the center of the memory component 300 is not aligned with and is deviated from the center of the semiconductor die 101. According to an embodiment, signals such as power or ground may be transmitted to the solder balls SB on the bottom surface 100*b* of the substrate 100 via the shorter conductive path comprised of the connecting elements BM, the TSVs 110 of the semiconductor die 101, and the conductive traces 100*t* of the substrate 100.

According to an embodiment, for example, a PCB assembly 50 and a PCB 60 may be mounted on the memory package 30 in a side-by-side manner. According to an embodiment, for example, the PCB assembly 50 and the PCB 60 may be electrically connected to the substrate 100 via the TMVs 322 in the molding compound 320. According to an embodiment, for example, the PCB assembly 50 may comprise a PCB 52 and components 503 and 505 mounted on opposite sides of the PCB 52, respectively.

Figure 6:
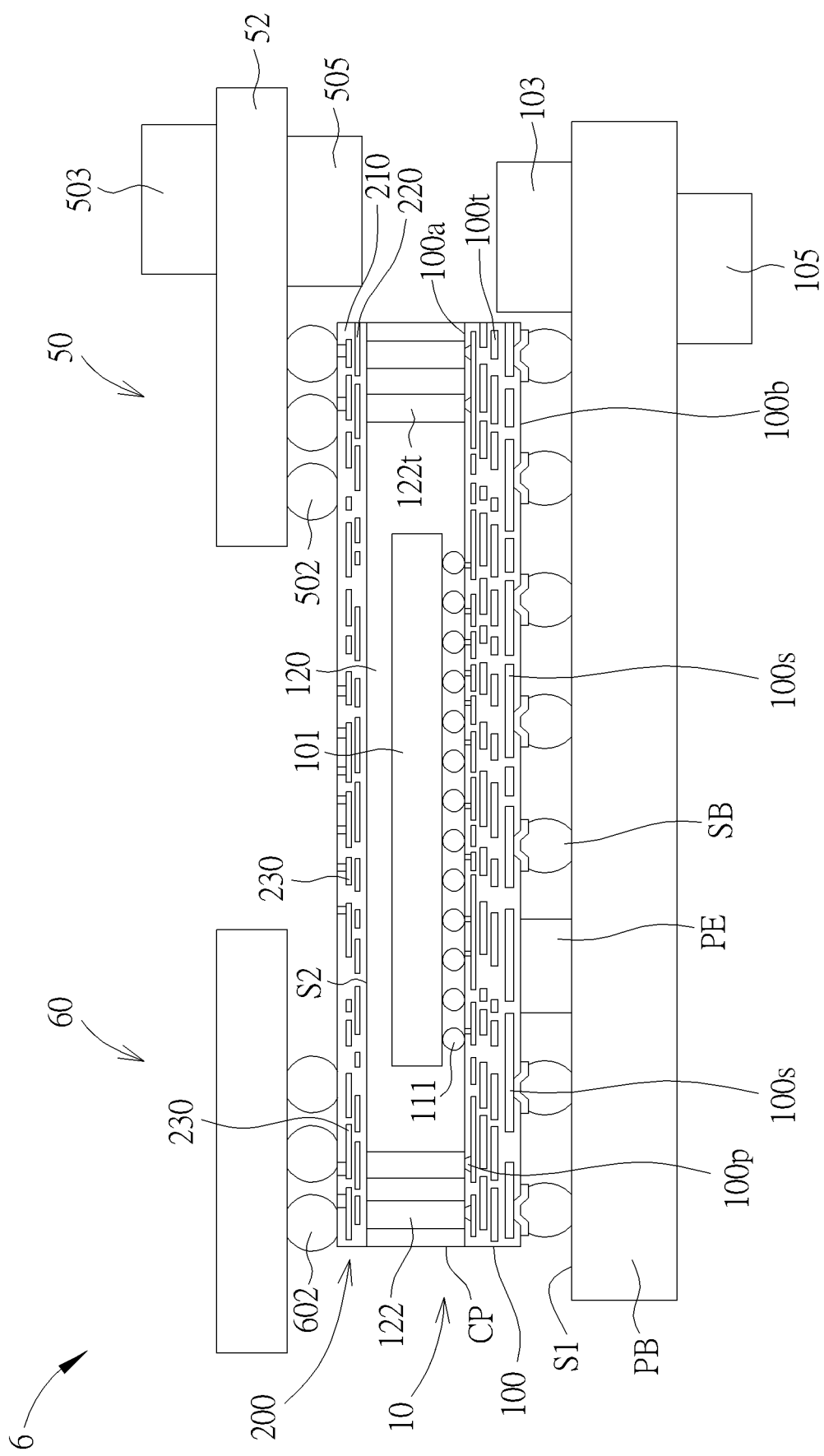
FIG. 6 is a schematic, cross-sectional diagram showing an exemplary electronic device with stacked PCBs in accordance with another embodiment of the disclosure.

FIG. 6 is a schematic, cross-sectional diagram showing an exemplary electronic device 6 with stacked PCBs in accordance with yet another embodiment of the disclosure, wherein like regions, layers or elements are designated by like numeral numbers or labels. In some embodiments, the electronic device 6 may serve as a 3D assembly including at least two vertically stacked PCBs respectively mounted on opposite sides of a semiconductor package.

As shown in FIG. 6, the electronic device 6 comprises a main PCB assembly 10 including, but not limited to, a bottom PCB PB and a semiconductor package CP mounted on an upper surface S1 of the bottom PCB PB. In some embodiments, for example, the semiconductor package CP may comprise a substrate 100 and a semiconductor die 101, such as a logic die, mounted on a top surface (die-attach surface) 100*a* of the substrate 100. The semiconductor die 101 may comprise a flip-chip die, a wire-bonding die, or a fan-out die. The semiconductor die 101 may be connected to the top surface 100*a* of the substrate 100 via a plurality of connecting elements 111 such as bumps or metal pillars, but not limited thereto. The semiconductor die 101 and the top surface 100*a* of the substrate 100 may be encapsulated by a molding compound 120 such as epoxy resin.

According to an embodiment, for example, additional components 103 and 105 may be mounted on the surfaces of the bottom PCB PB. The additional components 103 and 105 may comprise active or passive components such as IC chips, capacitors, resistors or inductors. Although the semiconductor die 101 is shown to be mounted on the top surface 100*a* of the substrate 100 in a flip-chip manner, it is understood that in some embodiments the semiconductor die 101 may be mounted on the substrate 100 by using wire-bonding techniques. In some embodiments, the semiconductor package CP may include a fan-out die.

In some embodiments, the semiconductor package CP may include one or more logic dies, including, but not limited to, a central processing unit (CPU), a graphics processing unit (GPU), a system-on-a-chip (SOC), a field-programmable gate array (FPGA), a microcontroller unit (MCU), a power management integrated circuit (PMIC) die, a radio frequency (RF) die, a sensor die, a micro-electro-mechanical-system (MEMS) die, a signal processing die (e.g., digital signal processing (DSP) die), or the like, or any combinations thereof.

According to an embodiment, for example, the substrate 100 may be a wiring substrate and may be formed of polymer materials such as bismaleimide triazine (BT) laminates and/or build-up films known in the art. In some embodiments, the substrate 100 may be a re-distribution layer (RDL) substrate comprising dielectric layers and conductive layers, and may have a thinner thickness compared to conventional package substrates. It is to be understood that the substrate 100 may be a single layer or a multi-layer structure.

According to an embodiment, for example, the substrate 100 may comprise a plurality of connection pads 100*p* disposed on or near the top surface 100*a* of the substrate 100. According to an embodiment, for example, the substrate 100 may comprise a plurality of conductive traces 100*t* interconnecting the plurality of connection pads 100*p* with a plurality of ball pads 100*s* distributed on or near a bottom surface 100*b* of the substrate 100. Solder balls SB are disposed on the ball pads 100*s*, respectively. In some embodiments, at least one passive device PE may be mounted on the bottom surface 100*b* of the substrate 100 using surface mount technique (SMT).

According to an embodiment, the electronic device 6 may further comprise a middle re-distribution layer (RDL) structure 200 on the semiconductor die 101. According to an embodiment, the middle RDL structure 200 may comprise dielectric layers 210 and interconnect structures 220. The interconnect structures 220 may be electrically connected to a plurality of RDL pads 230. According to an embodiment, a plurality of through mold vias (TMVs) 122 may be disposed in the molding compound 120. The TMVs 122 may be electrically connected to the interconnect structures 220 of the middle RDL structure 200.

According to an embodiment, for example, a PCB assembly 50 and a PCB 60 may be mounted on the corresponding RDL pads 230 of the middle RDL structure 200 through connecting elements 502 and 602, respectively. According to an embodiment, for example, the PCB assembly 50 may comprise a PCB 52 and components 503 and 505 mounted on opposite sides of the PCB 52. According to an embodiment, for example, the components 503 and 505 may comprise memory devices, antenna devices or radio-frequency (RF) devices. According to an embodiment, for example, the connecting elements 502 and 602 may comprise solder balls or any suitable conducive joints known in the art. According to an embodiment, the PCB assembly 50 is physically separated from the PCB 60 and disposed on the middle RDL structure 200 with the PCB 60 in a side-by-side manner.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
   a main printed circuit board (PCB) assembly comprising a bottom PCB and a semiconductor package mounted on an upper surface of the bottom PCB, wherein the semiconductor package comprises a substrate and a semiconductor die mounted on a top surface of the substrate, wherein the semiconductor die and the top surface of the substrate are encapsulated by a molding compound, wherein the semiconductor die has an active surface and a rear surface coupled to the top surface of the substrate, wherein the semiconductor die comprises through silicon vias;
   a top PCB mounted on the semiconductor package through first connecting elements, wherein the top PCB only overlaps with a peripheral region of a top surface of the semiconductor package; and
   a middle re-distribution layer (RDL) structure disposed between the semiconductor die and the top PCB, wherein the active surface of the semiconductor die is directly connected to the middle RDL structure through second connecting elements, wherein the middle RDL structure comprises dielectric layers and interconnect structures.

2. The electronic device according to claim 1, wherein the semiconductor die comprises a flip-chip die, a wire-bonding die, or a fan-out die.

3. The electronic device according to claim 1 further comprising:
   a memory component mounted on the middle RDL structure and electrically connected to the substrate via the interconnect structures of the middle RDL structure and the through silicon vias of the semiconductor die.

4. The electronic device according to claim 1 further comprising:
   a plurality of through mold vias (TMVs) disposed in the molding compound, wherein the TMVs penetrate through an entire thickness of the molding compound, thereby forming terminals on a top surface of the semiconductor package.

5. The electronic device according to claim 1, wherein the substrate is a re-distribution layer (RDL) substrate.

6. The electronic device according to claim 1 further comprising:
   a top PCB assembly mounted on the semiconductor package through third connecting elements.

7. The electronic device according to claim 3 further comprising:
   a heat sink mounted on the middle RDL structure around the memory component.

8. The electronic device according to claim 3, wherein the memory component is High-Bandwidth Memory (HBM) comprising dynamic random-access memory (DRAM) dies stacked on one another, which are vertically interconnected by through silicon vias.

9. The electronic device according to claim 4, wherein the top PCB is mounted on the terminals.

10. The electronic device according to claim 6, wherein the PCB assembly comprises a PCB and a component mounted on the PCB.

11. The electronic device according to claim 10, wherein the component comprises a memory device, an antenna device or an RF device.

12. An electronic device, comprising:
    a main printed circuit board (PCB) assembly comprising a bottom PCB and a semiconductor package mounted on an upper surface of the bottom PCB, wherein the semiconductor package comprises a substrate, a semiconductor die mounted on a top surface of the substrate, and a memory component mounted on the semiconductor die; and
    a top PCB mounted on the semiconductor package through first connecting elements, wherein the top PCB only overlaps with a peripheral region of a top surface of the semiconductor package; and
    a middle re-distribution layer (RDL) structure disposed between the semiconductor die and the memory component, wherein the active surface of the semiconductor die is directly connected to the middle RDL structure through second connecting elements, wherein the middle RDL structure comprises dielectric layers and interconnect structures.

13. The electronic device according to claim 12, wherein the semiconductor die has an active surface and a rear surface coupled to the top surface of the substrate, wherein the semiconductor die comprises through silicon vias.

14. The electronic device according to claim 12, wherein the memory component is High-Bandwidth Memory (HBM) comprising dynamic random-access memory (DRAM) dies stacked on one another, which are vertically interconnected by through silicon vias.

15. The electronic device according to claim 12, wherein the semiconductor die and the top surface of the substrate are encapsulated by a first molding compound, and wherein the memory component is encapsulated by a second molding compound.

16. The electronic device according to claim 12, wherein the semiconductor die, the memory component, and the top surface of the substrate are encapsulated by a unified molding compound.

17. The electronic device according to claim 13, wherein the active surface directly faces the memory component.

18. The electronic device according to claim 13, wherein the active surface directly faces the substrate.

19. The electronic device according to claim 15 further comprising:
    a plurality of first through mold vias (TMVs) disposed in the first molding compound, wherein the first TMVs penetrate through an entire thickness of the first molding compound.

20. The electronic device according to claim 19 further comprising:
    a plurality of second through mold vias (TMVs) disposed in the second molding compound, wherein the second TMVs penetrate through an entire thickness of the second molding compound.

* * * * *